(12) United States Patent
Kim et al.

(10) Patent No.: US 7,528,630 B2
(45) Date of Patent: May 5, 2009

(54) HIGH SPEED FLIP-FLOP

(75) Inventors: Min-Su Kim, Hwaseong-si (KR); Bai-Sun Kong, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/970,629

(22) Filed: Jan. 8, 2008

(65) Prior Publication Data
US 2008/0164910 A1    Jul. 10, 2008

(30) Foreign Application Priority Data
Jan. 8, 2007    (KR) .................... 10-2007-0002115

(51) Int. Cl.
*H03K 19/00*    (2006.01)
(52) U.S. Cl. ........................... 326/93; 326/121
(58) Field of Classification Search ............. 326/93–98, 326/112, 119, 121
See application file for complete search history.

(56) References Cited

U.S. PATENT DOCUMENTS

| | | | |
|---|---|---|---|
| 5,796,282 A * | 8/1998 | Sprague et al. ............. 327/210 |
| 6,184,718 B1 * | 2/2001 | Tran et al. .................... 326/121 |
| 6,201,415 B1 * | 3/2001 | Manglore .................... 326/98 |
| 2004/0041594 A1 | 3/2004 | Kang et al. | |
| 2004/0080351 A1 | 4/2004 | Hirata et al. | |
| 2006/0103430 A1 * | 5/2006 | Yuan et al. ................... 326/97 |

FOREIGN PATENT DOCUMENTS

| | | |
|---|---|---|
| JP | 2002208841 | 7/2002 |
| KR | 1020020031275 A | 5/2002 |
| KR | 1020050011439 A | 1/2005 |

* cited by examiner

*Primary Examiner*—Don P Le
(74) *Attorney, Agent, or Firm*—Volentine & Whitt, PLLC

(57) ABSTRACT

A flip-flop circuit includes a precharging circuit which precharges a first circuit node in response to a first pulse signal and an estimation circuit that receives an input signal and a second pulse signal. The estimation circuit discharges the voltage from the first node in response to the input signal on activation of the second pulse signal. The first pulse signal is synchronized to a clock signal and the second pulse signal is delayed from the first pulse signal.

27 Claims, 3 Drawing Sheets

US 7,528,630 B2

HIGH SPEED FLIP-FLOP

CROSS-REFERENCE TO RELATED APPLICATIONS

This application claims the benefit of Korean Patent Application No. 10-2007-0002115, filed on Jan. 8, 2007, in the Korean Intellectual Property Office, the disclosure of which is incorporated herein in its entirety by reference.

BACKGROUND OF THE INVENTION

1. Field of the Invention

Embodiments of the invention relate to digital electronic circuits. More particularly, embodiments of the invention relate to high speed flip-flops used in integrated circuits.

2. Discussion of Related Art

A conventional flip-flop circuit includes a master latch and a slave latch. Data is supplied to each latch through transmission gates controlled by clock signals. Flip-flop circuits are typically used in microprocessors to provide maximum available logic clocking speeds. This is done by shortening the data-to-output times (or setup times) and clock-to-output times. FIG. 1 is a diagram showing a typical delay path in a digital circuit used in, for example, a microprocessor. The delay path includes first register 10, second register 12, and combination logic block 11. First and second registers 10 and 12 operate in sync with clock signal CLK and for the purposes of explanation, operate in sync with rising edges of clock signal CLK.

FIG. 2 is a timing diagram where first register 10 transfers data to combination logic block 11 at a first rising edge of clock signal CLK. Generally, there is a delay time T1 that is also called a "clock-to-output delay time" before data is output from first register 10. The clock-to-output delay time T1 is the time from a transition of clock signal CLK to the time when data is output from first register 10. Data output from first register 10 is transferred through combination logic block 11 and input to input terminal D2 of second register 12 before the rising edge of clock signal CLK. The time defined between a rising edge of clock signal CLK and an input of data signal T3 is referred to as the "data-to-output delay time" (or setup time). The data-to-output delay time T3 is the minimum time for maintaining a data signal input to second register 12 before a rising edge of clock signal CLK.

The data-to-clock time is the sum of the clock-to-output delay time T1 and the data-to-output delay time T3. In order to maximize the performance of the delay path, the data-to-clock time is minimized which assures maximum propagation time T2 for which data is transferred through combination logic block 11. Shortening the data-to-output delay time T3 may enhance the frequency of clock signal CLK, thereby improving circuit performance. By providing a longer delay path to combination logic block 11, the number of pipeline stages required by a microprocessor may be reduced. In addition, a sense-amplifier based flip-flop used for sensing a small signal is operable in higher speeds as compared to a conventional flip-flop. However, a sense amplifier flip-flop is limited by shortening the data-to-output delay time.

SUMMARY OF THE INVENTION

Exemplary embodiments of the present invention are directed to a flip-flop circuit that operates at a high frequency. In an exemplary embodiment, the flip-flop circuit includes a precharging circuit connected to a first node and configured to precharge the first node in response to a first pulse signal. The first pulse signal is synchronized to a clock signal. An estimation circuit is connected to the first node and is configured to receive an input signal and a second pulse signal. The estimation circuit discharges a voltage associated with the first node in response to the input signal upon activation of the second pulse signal and the second pulse signal is delayed by a time period with respect to the first pulse signal.

DESCRIPTION OF EMBODIMENTS

Figure 1:
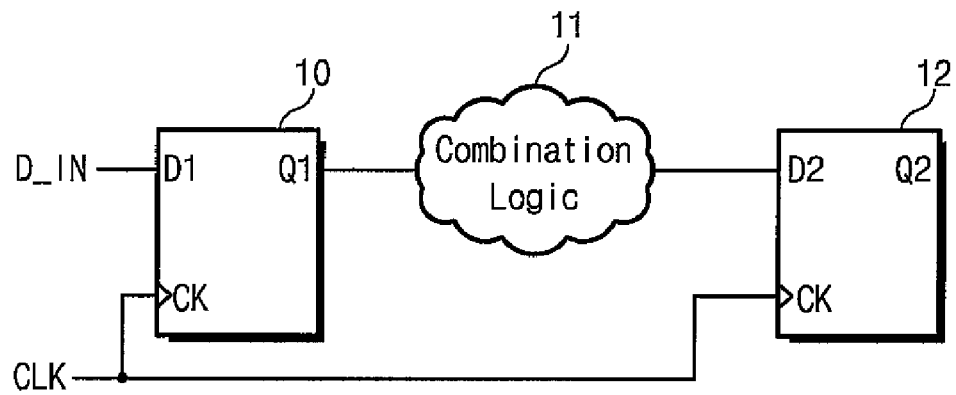
FIG. 1 is a diagram showing a typical delay path in a digital circuit.
Figure 2:
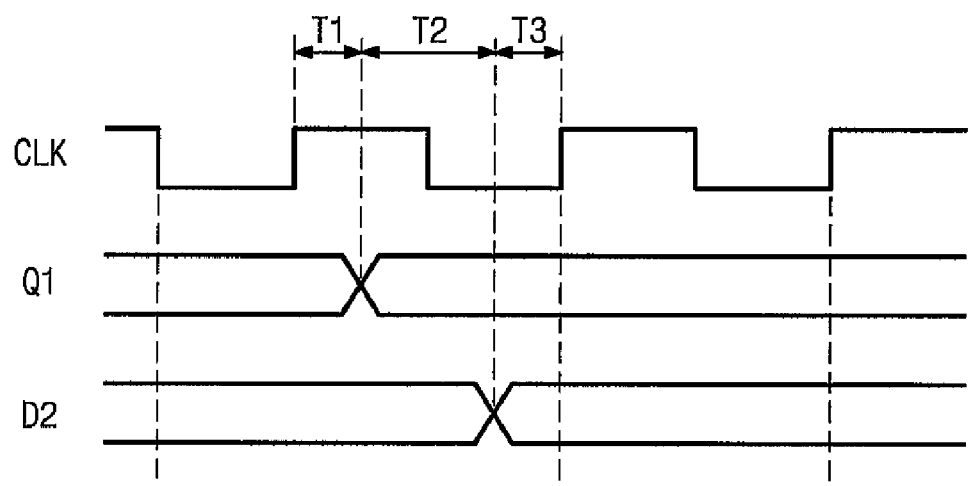
FIG. 2 is a timing diagram of signals used in the digital signal shown in FIG. 1.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 3:
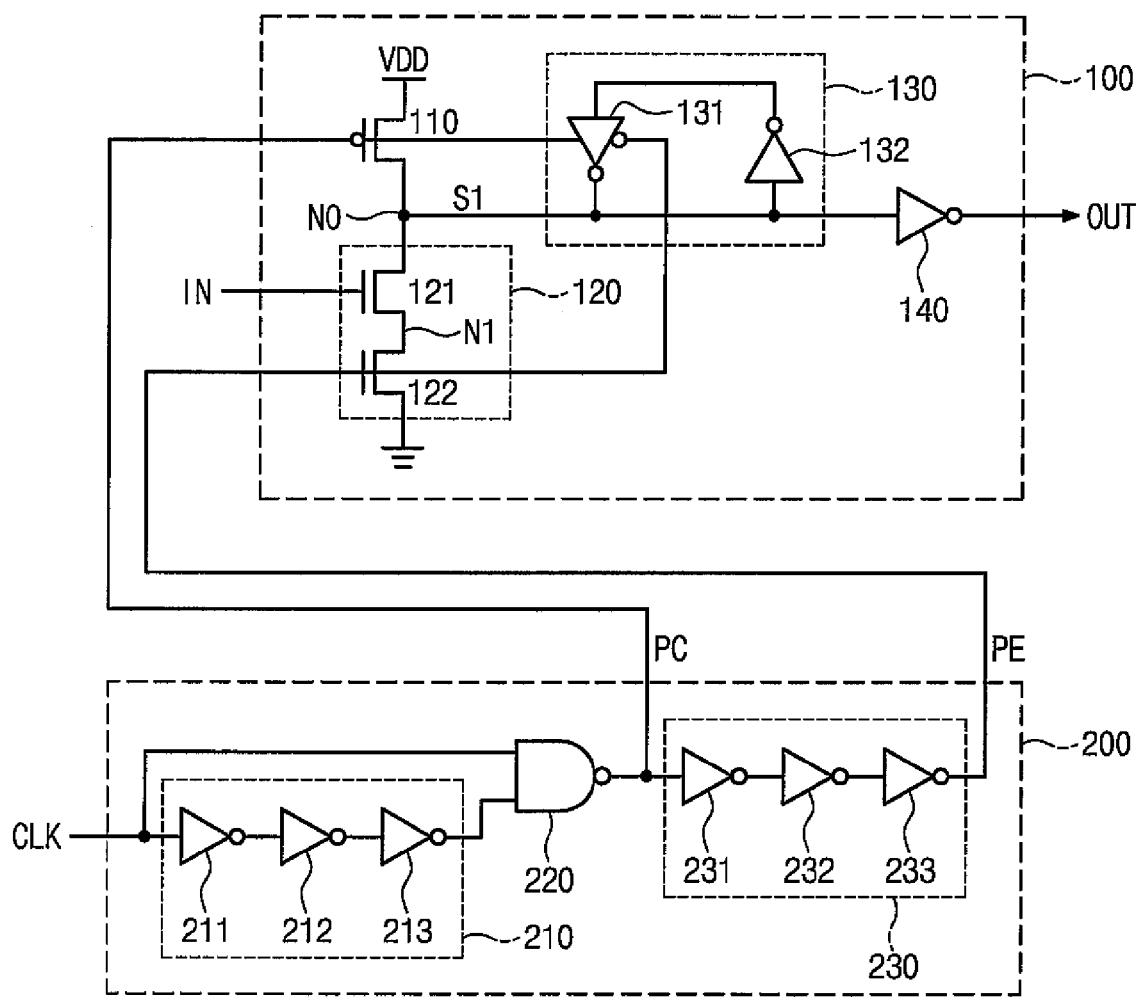
FIG. 3 is a circuit diagram of a flip-flop according to a preferred embodiment in accordance with the present invention.

FIG. 3 is a circuit diagram of a flip-flop 100 including precharging transistor 110, estimation circuit 120, latch 130, and output circuit 140. Precharging transistor 110 is connected between power source voltage VDD and node N0 and is controlled by first pulse signal PC. Precharging transistor 110 is formed of a PMOS transistor that precharges node N0 to power source voltage VDD while first pulse signal PC is at a logic low. Signal S1 is precharged at node N0, is held by latch 130 and driven to output signal OUT through output circuit 140.

Estimation circuit 120 is connected between node N0 and ground voltage and is configured to receive input signal IN and second pulse signal PE. Estimation circuit 120 includes transistor 121 connected between nodes N0 and N1 and discharging transistor 122 connected between node N1 and the ground voltage. Transistors 121 and 122 are NMOS transistors where transistor 121 is controlled by input signal IN and NMOS transistor 122 is controlled by second pulse signal PE. Estimation circuit 120 operates to evaluate the voltage level of input signal IN on activation of second pulse signal PE. Estimation circuit 120 selectively discharges signal S1 from node N0 in response to the voltage level of input signal IN.

Output circuit 140 is formed of inverter 140, but may alternatively be implemented in a logic circuit utilizing, for example, NAND or NOR circuits. Latch 130 includes tri-state buffer 131 and inverter 132 connected to node N0. Tri-state buffer 131 transfers an input signal to its output corresponding to first and second pulse signals PC and PE. Tri-state buffer 131 may be replaced by a combination circuit formed of an inverter and a transmission gate or an inverter. Alternatively, flip-flop 100 is configured to maintain signal S1 at node N0 by parasitic capacitance even without latch 130.

As flip-flop 100 precharges signal S1 of node N0 to source voltage VDD in accordance with the transition of first pulse signal PC to a logic low level, flip-flop 100 sets output signal OUT to a logic low before input of signal IN. In this manner, the data-to-output delay time DQ of flip-flop 100 is settled to a negative value. If input signal IN goes to a logic high, estimation circuit 120 discharges signal S1 of node N0 to ground voltage. Signal S1 of node N0 is discharged through cascadedly connected NMOS transistors 121 and 122 such that the discharging speed of the transistors is high which increases the operating speed of flip-flop 100.

Pulse generator 200 receives clock signal CLK and generates first and second pulse signals PC and PE for controlling flip-flop 100. Although such a circuit may include many flip-flops 100, one pulse generator 200 may be sufficient and pulse generator 200 may be included with flip-flop 100. Pulse generator 200 includes delay circuits 210 and 230, and NAND gate 220. Delay circuit 210 includes odd-numbered inverters 211-213 configured to delay and invert clock signal CLK. NAND gate 220 receives the output signal from delay circuit 210 and clock signal CLK and outputs first pulse signal PC. Delay circuit 230 receives first pulse signal PC as an output of NAND gate 220 and outputs second pulse signal PE. Delay circuit 230 includes odd-numbered inverters 231~233 which delays and inverts first pulse signal PC.

Figure 4:
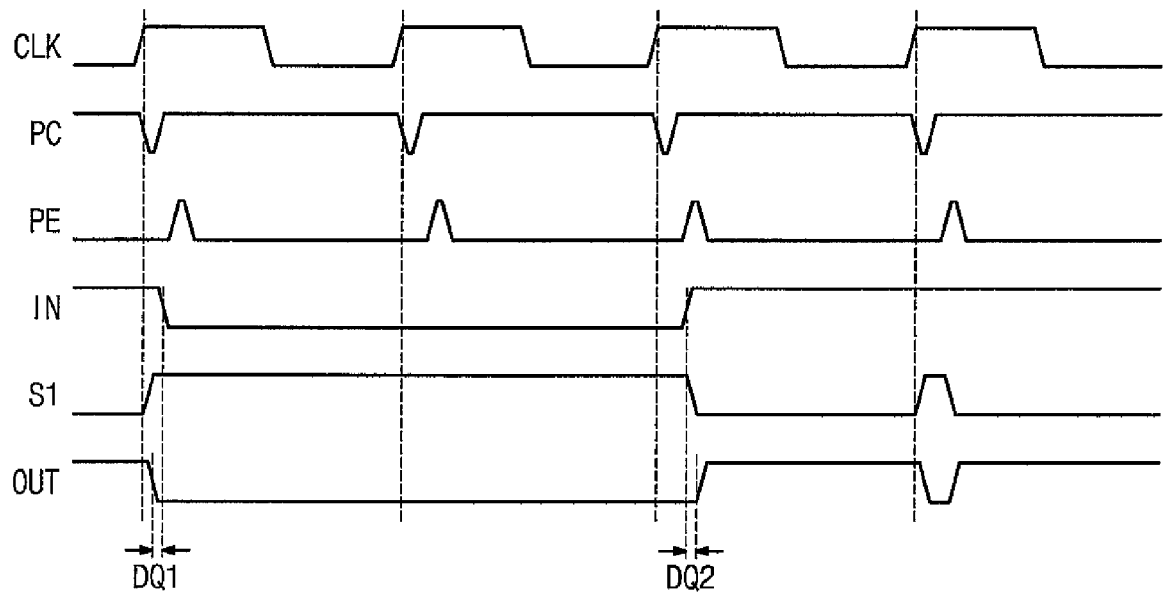
FIG. 4 is a timing diagram of signals input/output into/from the flip-flop shown in FIG. 3.

FIG. 4 is a timing diagram of the input and output of flip-flop 100 shown in FIG. 3. First pulse signal PC is generated at the rising edge of clock signal CLK and is sufficiently set to precharge signal S1 of node N0 to source voltage VDD by precharging transistor 110. The pulse width of first pulse signal PC can be adjusted by the number of inverters 211-213 of delay circuit 210. Second pulse signal PE is produced by delaying and inverting first pulse signal PC. The pulse width associated with second pulse signal PE is sufficiently discharged such that signal S1 of node N0 is discharged down to ground voltage by discharging transistor 122 of estimation circuit 120. The number of the inverters 231-233 of the delay circuit 230 can vary to control the overlap of first pulse signal PC with second pulse signal PE.

Input signal IN may vary in four different cases: (1) from logic high to logic low; (2) from logic low to logic low (i.e., maintaining logic low); (3) from logic low to logic high; and (4) from logic high to logic high (i.e., maintaining logic high). When input signal IN varies from logic high to logic low, first pulse signal PC is generated in sync with clock signal CLK and signal S1 of node N0 is precharged to source voltage VDD regardless of the level of input signal S1. Output signal OUT transitions to a logic low level, output signal OUT appears before input signal IN and the data-to-output delay time DQ1 is negative. Input signal IN transitions to a logic low from a logic high which turns transistor 121 off. If second pulse signal PE is output from pulse generator 230 after being delayed and inverted from first pulse signal PC, discharging transistor 122 is turned on. As transistor 121 is being turned off while discharging transistor 122 is turned on, signal S1 of node N0 is not discharged from its voltage level. As a result, output signal OUT is maintained at a logic low.

When input signal IN is maintained at a logic low at the rising edge of clock signal CLK, transistor 121 maintains its turn-on state by input signal IN while signal S1 of node N0 is precharged to a logic high and precharged signal S1 is maintained at a logic high. Thus, output signal OUT does not change from logic low. If input signal IN goes to logic high from a logic low and second pulse signal PE is generated, transistors 121 and 122 of estimation circuit 120 are all turned on in order to discharge precharged signal S1 to the ground voltage. As signal S1 of node N0 is discharged through the cascaded-connected NMOS transistors 121 and 122, the discharging speed of signal S1 is relatively fast. Thus, the data-to-output delay time DQ2 of flip-flop 100 is shortened.

In the case when input signal IN is maintained at a logic high at a rising edge of clock signal CLK, signal S1 of node N0 is precharged up to level of power source voltage VDD in response to first pulse signal PC. As signal S1 of node N0 is precharged to power source voltage VDD, output signal OUT transitions down to a logic low. Transistor 121 is turned on because input signal IN is at a high level. Transistor 122 is turned on in response to second pulse signal PE to discharge signal S1 of node N0 to the ground voltage. Thus, output signal OUT returns to logic high. While input signal IN is at a logic high, output signal OUT transitions to a logic high after falling to a logic low from logic high. The time for maintaining the output signal OUT at a logic low is the time between when the first pulse signal PC goes to a logic low and the point when second pulse signal PC goes to a logic low. Although the switching operation of output signal OUT slightly increases the power consumption of flip-flop 100, the period for maintaining input signal IN at logic high is not more than ¼ of the operation period. Combination logic circuit 10 shown in FIG. 1 may be comprised of a circuit for correcting a malfunction due to the abnormal switching operation of output signal OUT. In this manner, flip-flop 100 operates with a negative data-to-output delay time DQ1 when input signal IN goes to a logic low from a logic high, minimizing the data-to-output delay time DQ2 when input signal IN goes to a logic high from a logic low. Thus, it improves the overall speed of circuit operation.

Figure 5:
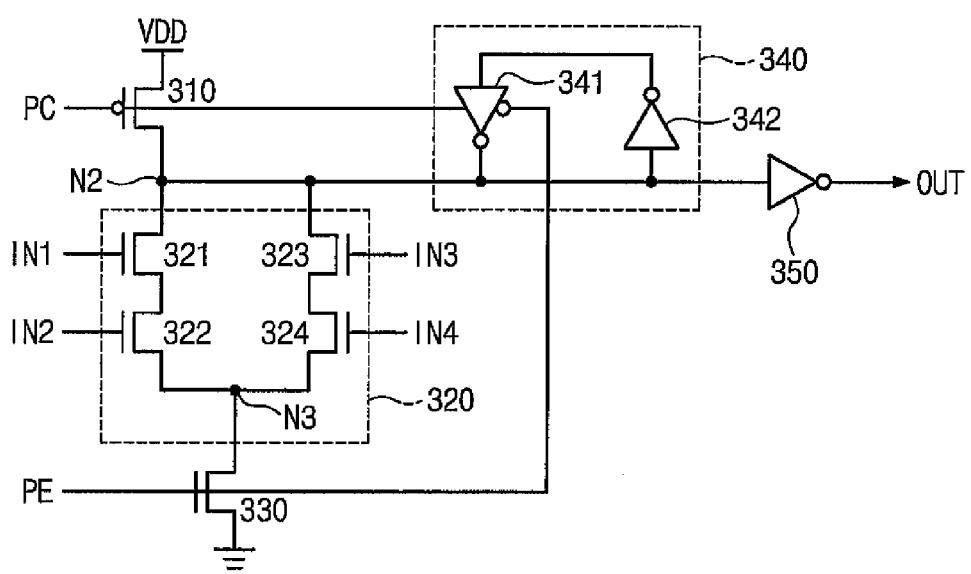
FIG. 5 is a circuit diagram of a flip-flop according to an embodiment of the present invention.

FIG. 5 is a circuit diagram of flip-flop 300 configured to receive a plurality of input signals IN1-IN4 and generate output signal OUT. Flip-flop 300 includes precharging transistor 310, input circuit 320, discharging transistor 330, latch 340, and output buffer 350. Precharging transistor 310, discharging transistor 330, latch 340, and output buffer 350 are same as those shown in FIG. 4. Input circuit 320 is connected between node N2 and node N3. Node N2 is connected to precharging transistor 310, and node N3 is connected to discharging transistor 320. Input circuit 320 includes four NMOS transistors 321-324 each controlled by input signals IN1-IN4, respectively. Flip-flop 300 precharges node N2 in response to the input signals IN1-IN4 when second pulse signal PE is at logic high. When input signals IN1 and IN2 are each a logic high, input signals IN3 and IN4 are high and the voltage signal of node N2 is discharged to generate output signal OUT at logic high.

As node N2 is precharged by first pulse signal PC, output signal OUT is generated before receiving input signals IN1-IN4 and data-to-output delay time DQ of flip-flop 300 becomes a negative value. When input signals IN1 and IN2 transition to logic lows from logic highs, or when input signals IN3 and IN4 go to logic lows from logic highs, the data-to-output delay time DQ turns to a negative value such that flip-flop 300 operates at a higher speed.

Transistors 321-324 of input circuit 320 are all NMOS transistors. Transistors 321 and 322 are cascadedly connected to NMOS transistor 330 and NMOS transistors 323 and 324 are also cascadedly connected to NMOS transistor 330. The data-to-output delay time DQ is shortened at least when input signals IN1 and IN2 transition to logic highs from logic lows or when input signals IN3 and IN4 transition to logic highs from logic lows. Input circuit 320 may be modified to include, for example, OR logic or NAND logic. Regardless of the circuit logic utilized for input circuit 320, the data-to-output delay time DQ of flip-flop 300 may have a negative value. Through the use of the flip-flop described herein, circuit operation speed is enhanced which improves the speed of the associated digital circuit.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A flip-flop comprising:
a precharging circuit connected to a first node, said precharging circuit configured to precharge said first node in response to a first pulse signal, said first pulse signal synchronized to a clock signal; and
an estimation circuit connected to said first node, said estimation circuit configured to receive an input signal and a second pulse signal, said estimation circuit discharging a voltage associated with said first node in response to said input signal upon activation of said second pulse signal, said second pulse signal delayed by a time period from said first pulse signal.

2. The flip-flop as set forth in claim 1, wherein said precharging circuit precharges the first node to a first voltage level and said estimation circuit discharges the voltage from said first node in response to said input signal on activation of said second pulse signal.

3. The flip-flop as set forth in claim 1, wherein the first and second pulse signals have predetermined pulse widths, the pulse width of said first pulse signal does not overlap the pulse width of said second pulse signal upon activation.

4. The flip-flop as set forth in claim 1, wherein said first pulse signal has a pulse width set to a time period sufficient to precharge the first node by said precharging circuit.

5. The flip-flop as set forth in claim 1, wherein said second pulse signal has a pulse width set to a time period sufficient to discharge the first node by said estimation circuit.

6. The flip-flop as set forth in claim 1 wherein the precharging circuit comprises a precharging transistor connected between a first power source voltage and said first node.

7. The flip-flop as set forth in claim 6, wherein said estimation circuit comprises:
an input circuit connected between said first and second nodes, said input circuit configured to electrically connect said first node to said second node in response to said input signal; and
a discharging transistor connected between said second node and a second power source voltage, said discharging circuit configured to discharge the voltage associated with said second node in response to said second pulse signal.

8. The flip-flop as set forth in claim 7, wherein said input circuit comprises:
an NMOS transistor connected between said first and second nodes and controlled by said input signal.

9. The flip-flop as set forth in claim 7, wherein said precharging transistor is a PMOS transistor and said discharging transistor is an NMOS transistor.

10. The flip-flop as set forth in claim 9, wherein the second pulse signal is delayed and inverted with respect to said first pulse signal.

11. The flip-flop as set forth in claim 1 further comprising a latch connected to said first node.

12. The flip-flop as set forth in claim 11, wherein said latch comprising:
an inverter having an input terminal connected to said first node, and an output terminal; and
a tri-state buffer having an input terminal connected to said output terminal of said inverter and an output terminal connected to said first node, said buffer being controlled by said first and second pulse signals.

13. The flip-flop as set forth in claim 1 further comprising an output buffer connected to said first node and generating an output signal.

14. A flip-flop comprising:
a precharging circuit connected to a first node, said precharging circuit configured to precharge said first node in response to a first pulse signal, said first pulse signal synchronized to a clock signal;
a discharging circuit connected to a second node and configured to discharge said second node in response to a second pulse signal, said second pulse signal delayed by a time period from said first pulse signal; and
an input circuit connecting the first node to the second node in response to an input signal.

15. The flip-flop as set forth in claim 14, wherein the first and second pulse signals have predetermined pulse widths, the pulse width of said first pulse signal does not overlap the pulse width of said second pulse signal upon activation.

16. The flip-flop as set forth in claim 14, wherein said first pulse signal has a pulse width set to a time period sufficient to precharge the first node by said precharging circuit.

17. The flip-flop as set forth in claim 14, wherein said second pulse has a pulse width set to a time period sufficient for discharging said first node which is connected to said input circuit by said discharging circuit.

18. The flip-flop as set forth in claim 14, wherein said precharging circuit comprises a precharging transistor connected between a first power source voltage and said first node.

19. The flip-flop as set forth in claim 18, wherein the input circuit comprises an NMOS transistor connected between said first and second nodes and controlled by said input signal.

20. The flip-flop as set forth in claim 19, wherein said precharging transistor is a PMOS transistor and said discharging transistor is an NMOS transistor.

21. The flip-flop as set forth in claim 20, wherein said second pulse signal is delayed and inverted with respect to said first pulse signal.

22. The flip-flop as set forth in claim 14 further comprising a latch connected to said first node.

23. A flip-flop comprising:
a first transistor connected between a power source voltage and a first node, said first transistor controlled by a first pulse signal;
a second transistor connected between said first node and a second node, said second transistor controlled by an input signal; and
a third transistor connected between said first node and a ground voltage, said third transistor controlled by a second pulse signal, said first and second pulse signals generated in sync with a clock signal.

24. The flip-flop as set forth in claim 23, wherein the first pulse signal has a predetermined first pulse width and said second pulse signal has a predetermined second pulse width, said first pulse width does not overlap said second pulse width upon activation.

25. The flip-flop as set forth in claim 23, wherein said first pulse signal has a first pulse width set to a time period sufficient to precharge said first node by said first transistor.

26. The flip-flop as set forth in claim 23, wherein said second pulse signal has a pulse width set to a time period sufficient to discharge said first node through said second transistor via said third transistor.

27. The flip-flop as set forth in claim 23 further comprising an output buffer configured to receive a voltage associated with said first node and generating an output signal.

* * * * *